United States Patent
Garetto et al.

(10) Patent No.: US 9,261,775 B2
(45) Date of Patent: Feb. 16, 2016

(54) METHOD FOR ANALYZING A PHOTOMASK

(71) Applicant: Carl Zeiss SMS GmbH, Jena (DE)

(72) Inventors: Anthony Garetto, Jena (DE); Thomas Scheruebl, Jena (DE); Gilles Tabbone, Jena (DE); Vahagn Sargsyan, Boise, ID (US); Doug Uzzel, Nampa, ID (US); Jon Morgan, Nampa, ID (US)

(73) Assignee: Carl Zeiss SMS GmbH, Jena (DE)

( * ) Notice: Subject to any disclaimer, the term of this patent is extended or adjusted under 35 U.S.C. 154(b) by 0 days.

(21) Appl. No.: 14/192,362

(22) Filed: Feb. 27, 2014

(65) Prior Publication Data

US 2014/0254915 A1    Sep. 11, 2014

Related U.S. Application Data

(60) Provisional application No. 61/775,782, filed on Mar. 11, 2013.

(51) Int. Cl.
 *G06K 9/00* (2006.01)
 *G03F 1/84* (2012.01)

(52) U.S. Cl.
 CPC ........................................ *G03F 1/84* (2013.01)

(58) Field of Classification Search
 None
 See application file for complete search history.

(56) References Cited

U.S. PATENT DOCUMENTS

| | | | | |
|---|---|---|---|---|
| 8,748,063 B2* | 6/2014 | Gallagher et al. | | 430/5 |
| 8,785,084 B2* | 7/2014 | Lu et al. | | 430/5 |
| 2006/0051681 A1* | 3/2006 | Taylor | | 430/5 |
| 2006/0095208 A1* | 5/2006 | Hirscher et al. | | 702/1 |
| 2008/0069431 A1 | 3/2008 | Zibold et al. | | |
| 2010/0081068 A1* | 4/2010 | Kim | | 430/5 |
| 2010/0154521 A1 | 6/2010 | Budach | | |
| 2010/0266937 A1* | 10/2010 | Zibold et al. | | 430/5 |
| 2013/0063716 A1 | 3/2013 | Mann et al. | | |

FOREIGN PATENT DOCUMENTS

| | | |
|---|---|---|
| DE | 10 2006 043 874 A1 | 3/2008 |
| DE | 10 2008 062 928 A1 | 7/2010 |
| DE | 10 2010 029 049 A1 | 11/2011 |
| DE | 10 2011 079 382 A1 | 1/2013 |
| WO | WO 2013/010976 | 1/2013 |

OTHER PUBLICATIONS

Ströβner et al., "AIMS™ and Resist Simulation", Proc. SPIE 7122 (2008) 48, 10 pages.
Zibold et al., "Aerial Image Measurement System for 157nm Lithography Masks", 2003 Semiconductor Equipment and Materials International, ISBN # 1-892568-78-0, 5 pages.

\* cited by examiner

*Primary Examiner* — Daniel Mariam
(74) *Attorney, Agent, or Firm* — Fish & Richardson P.C.

(57) ABSTRACT

A method for analyzing a photomask comprises the determination of a Bossung plot.

21 Claims, 4 Drawing Sheets

METHOD FOR ANALYZING A PHOTOMASK

CROSS-REFERENCE TO RELATED APPLICATIONS

This application claims priority under 35 U.S.C. §119(e)(1) to U.S. Provisional Application No. 61/775,782, filed Mar. 11, 2013. The contents of this application are hereby incorporated by reference in its entirety.

The invention relates to a method for analyzing a photomask. The invention further relates to a method for repairing a photomask. Finally, the invention relates to a repair system for the repair of photomasks.

Photomasks for lithographic purposes can have unwanted defects. In order to analyse EUV masks for defects, a scanning electron microscope or an atomic force microscope can be used. Thus, this analysis is slow and requires an additional step in another costly tool.

It is an object of the invention to improve a method for analyzing a photomask.

This objective is achieved by a method for analyzing a photomask comprising the following steps: a. providing a metrology system for analyzing photomasks, b. providing a photomask to be analysed, c. acquiring an aerial image stack of at least a feature of the photomask, d. determining a Bossung plot, and e. determining at least one parameter from the Bossung plot to characterise the photomask.

The core of the invention comprises the acquisition of an aerial image stack of the photomask or at least a feature thereof, from which a Bossung plot is determined, which can be further used to determine at least one parameter to characterise the photomask.

No additional tool such as an atomic force microscope is necessary for this analysis. Accordingly, the method according to this invention is less time consuming and more economic.

The Bossung plot can be determined from an aerial image stack, which is obtained when the photomask is imaged. According to the invention it was realised, that this plot can be used to indicate a height difference of the structures of the photomask, in particular a height difference of the quartz of these structures. By that the need for an extra processing step in another tool could be eliminated.

In particular, it was realised, that in case of photomasks for EUV-lithography the Bossung plot can provide immediate feedback on whether there is a defect in form of a pit or a bump. Furthermore, the Bossung plot can be useful in determining other important characteristics such as the size and/or the depth of possible defects.

According to an aspect of the invention the parameter determined from the Bossung plot to characterize the photomask is the slope of the Bossung plot. It was realized, that EUV photomask bump type defects lead to a positive slope of the Bossung plot. Similarly, for 193 nm photomasks, a quartz level lower than the surrounding regions, i.e. overetching of the quartz, leads to a positive slope of the Bossung plot. On the other hand, pit defects of EUV photomasks lead to a negative slope. Similarly, a quartz level higher than the surrounding regions on 193 nm photomask, i.e. underetching, leads to a negative slope.

Other characteristics which may be used to characterize the photomask are the symmetry of the Bossung plot and/or higher order parameters Thus, it is very easy to derive information about possible defects from the Bossung plot. The slope of the Bossung plot can in particular be easily determined by curve fitting.

According to an aspect of the invention, the Bossung plot is determined with a two-dimensional resolution of the entire photomask or a feature of a photomask to be analysed. The resolution is in particular in the order of 0.1 µm to 10 µm. At least a feature, i.e. some area of the photomask is analysed.

According to a further aspect of the invention the parameter determined from the Bossung plot provides a measure of a size and/or a depth of a defect of the photomask. Thus, it provide immediate information about such a defect.

According to a further aspect of the invention the analysis is fully automated. It is in particular independent from an interaction of a specialist. It does in particular not require any manual calculations.

According to a further aspect of the invention the analysis method is performed in a standalone metrology system. In particular, the need of an atomic force microscope is obviated. Thus, the method is both, faster and cheaper.

It is another objective of the invention to improve a method for repairing a photomask.

This objective is achieved by a method for repairing a photomask comprising the following steps: a. providing a repair system for the repair of photomasks, b. providing a photomask, c. analyzing the photomask using a method as discussed above, in order to determine at least one repair parameter, d. feed forward the repair parameter to the repair system, and e. determining the process required for a repair of the photo-mask in dependence of the repair parameter.

The core of the invention comprises analyzing the photomask according to the method described above and forwarding a repair parameter determined from the Bossung plot to a repair system, wherein the process required for a repair of the photomask is determined in dependence of the repair parameter.

In particular, from the repair parameter it can be determined, whether material, in particular quartz material, has to be deposited on or removed from the structures of the photomask.

As described above for the analysis method the repair of a photomask is greatly facilitated. In particular, as outlined above, no additional tool such as an atomic force microscope is needed.

According to an aspect of the invention material is deposited on or removed from the photomask before a subsequent analysis of the photomask. Material can in particular be deposited on or removed from a existing photomask feature before a subsequent analysis of the photomask. In particular, a predetermined amount of material is deposited on or removed from such a feature. This is also referred to as deposition or removal step. The sequence of deposition or removal step and subsequent analysis is also referred to as deposition-analysis-cycle or removal-analysis-cycle, respectively. These cycles can be repeated.

By depositing or removing material on the photomask before a subsequent analysis, the effect of such a deposition or removal can be analysed, in particular calibrated.

According to a further aspect of the invention material is deposited on or removed from the same photomask feature before a further subsequent analysis of the photomask. In other words, the deposition-analysis-cycle or the removal-analysis-cycle is repeated at least twice. It is also possible to run a deposition-analysis-cycle followed by a removal-analysis-cycle or vice versa.

According to a further aspect of the invention the photomask is analysed at least twice. If material is deposited on or removed from the photomask in between the analysis step, the multiple analysis steps can be used to analyse the effect of such a deposition or removal.

According to a further aspect of the invention an extrapolation step is used to determine an amount of material to be deposited on or removed from the photomask. It is in particular possible to determine optimal process parameters for the repair of the photomask. It is in particular possible, to fit a linear regression line to the multiple measurements and derive optimal repair parameters from that.

According to a further aspect of the invention the repair parameter comprises a measure for the amount of material to be deposited or removed from the photomask. Thus, it is possible to determine a processing time required to obtain an ideal process height or depth.

According to another aspect of the invention the analysis is fully automated. In particular, the repair of the photomask can be fully automated. This leads to a faster and more reliable repair of the photomask.

According to another aspect of the invention the entire repair process is performed in a single system. It can in particular be performed in a standalone system. There is in particular no need for an atomic force microscope or an atomic force microscopy method. The method is thus easier, cheaper and faster.

Another objective of the invention is to provide an improved repair system.

This objective is achieved by a repair system for the repair of photomasks, comprising: a. a metrology module for acquiring an aerial image stack of a photomask, b. an analysis module for analyzing the aerial image stack of the photomask and for determining at least one repair parameter, and c. a repair module, wherein the repair parameter determined by the analysis module is fed forward to the repair module.

The core of the invention is to provide a repair system with a metrology module for acquiring an aerial image stack of a photomask, an analysis module for analyzing the aerial image stack of a photomask and for determining at least one repair parameter and a repair module, wherein the repair parameter determined by the analysis module is fed forward to the repair module.

The advantage of such a repair system follow from those described for the repair method.

In the following some embodiments of the invention will be described with help of the figures.

A photomask 1 for a lithography system, in particular for an EUV lithography system, comprises certain structures 2, which ideally have a predetermined height. The structures 2 comprise in particular quartz. They can consist of quartz. In general, the photomask 1 can be a 193 nm photomask, i.e. a photomask to be used with DUV radiation, in particular radiation of a wave length of 193 nm, or an EUV-lithography photomask, i.e. a photomask to be used in an EUV-lithographic system with a wave length of less than 30 nm.

In case of EUV-photomasks the structure 2 comprise multiple layers 3.

Figure 1:
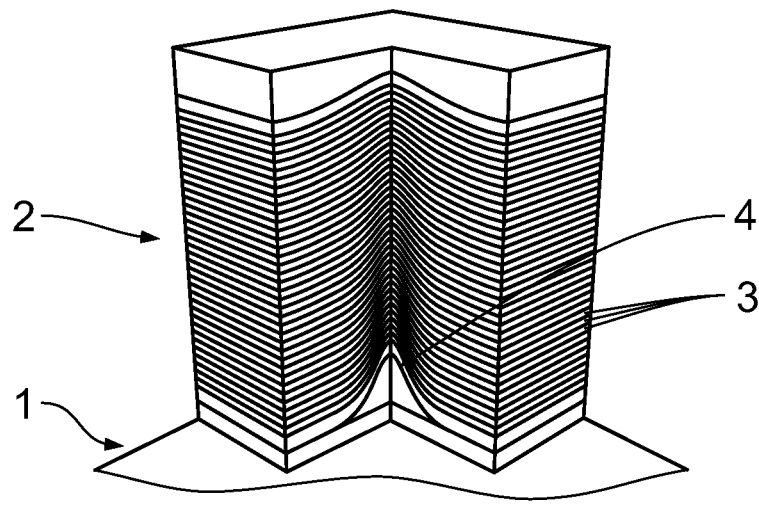
FIG. 1 shows a schematic drawing of a bump defect.

For different reasons defects 4 known as multilayer defects can arise. Two such defects 4 are shown in the schematic drawings of FIG. 1 and FIG. 3, respectively. The defects 4 can cause a local change in the phase of the reflective EUV-photomask 1. They can result in an imperfection in the aerial image and therefore they can lead to a defect on the wafer.

Figure 3:
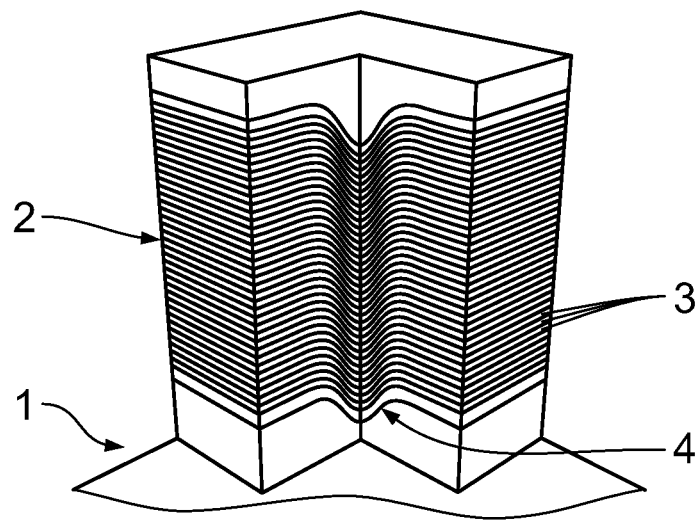
FIG. 3 shows a schematic view of a pit defect.

The defects 4 can be present somewhere in or below the deposited layers 3. They can take the form of small bumps (FIG. 1) or pits (FIG. 3). These bumps or pits appear on the surface of the multilayer structure 2. They can have a size, in particular a diameter, in the order of tens of nanometers. They can have a height or depth, respectively in the order of nanometers.

The shallow, rounded nature of the defects 4 make them difficult or even impossible to see with a scanning electron microscope. Usually they require the use of an atomic force microscope in order to find them, in particular to determine how to repair them.

It was realised, that the critical dimension (CD) and intensity of the aerial image of the photomask 1 can provide useful information about the defects 4. In particular, it was found, that with the help of a Bossung plot 5, which plots the critical dimension (CD) versus the depth of focus (DOF), one can determine, whether the defect 4 is a bump (FIGS. 1 and 2) or a pit (FIGS. 3 and 4).

The Bossung plot 5 can be calculated, in particular automatically calculated, for a captured aerial image stack, which is acquired by a metrology system, such as described in DE 10 2010 029 049 A1, which hereby is incorporated by reference in its entirety.

Figure 2:
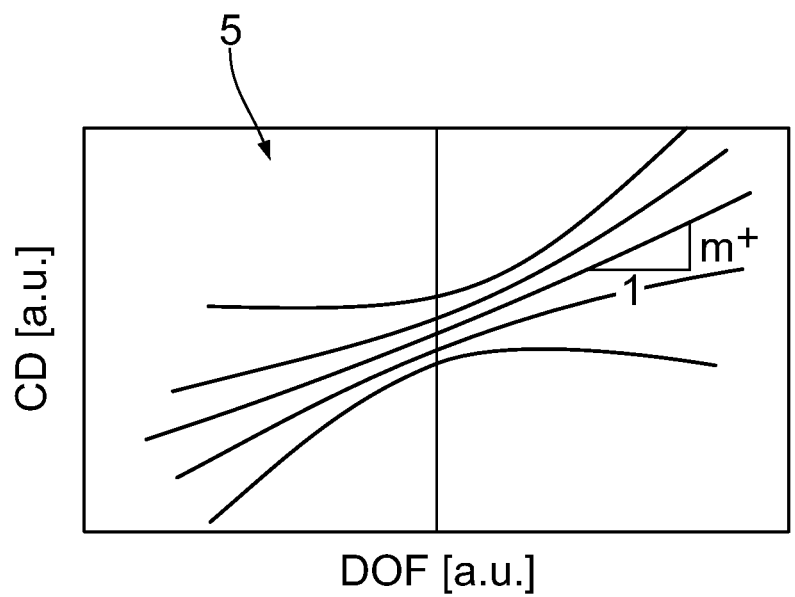
FIG. 2 shows a schematic Bossung plot of a bump defect.

It was realised, that the slope m of the Bossung plot 5 ideally has a value of zero in the case that the phase is perfectly matched, i.e., the quartz of the measured area is equal to that of the surrounding area. However, in the case of a bump defect the Bossung plot 5 will have a positive slope $m^+$, as shown in FIG. 2 in an exemplary way.

Figure 4:
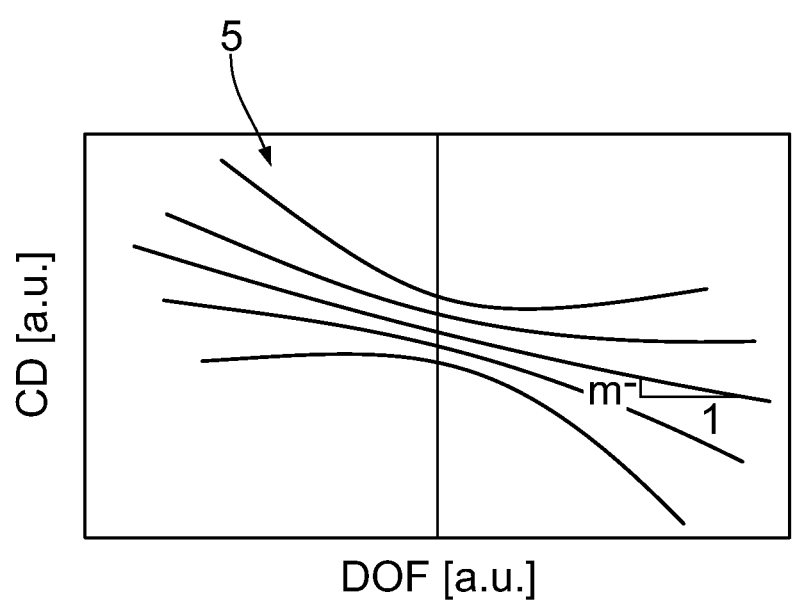
FIG. 4 shows a schematic Bossung plot of a pit defect.

Similarly, in case of a pit defect the Bossung plot 5 will have a negative slope as shown in FIG. 4 in an exemplary way.

Similarly, for 193 nm photomasks overetching leads to a quartz level lower than the surrounding regions and thereby to a positive slope $m^+$ of the Bossung plot 5. Conversely, underetching leads to a quartz level higher than the surrounding regions and thereby to a negative slope $m^-$ of the Bossung plot 5

In addition to the slope m of the Bossung plot 5 other parameters, such as a parameter quantifying its symmetry or asymmetry properties or higher order parameters can be determined from the Bossung plot 5.

Thus, with help of the Bossung plot 5 information about the defects 4, in particular their size and/or depth, can be derived. This information can be used to adjust a repair process of the photomask 1. In particular, such information can be fed forward to a repair 2. In can in particular be used to determine optimal repair parameters of a repair process.

In particular, the value of the slope m has a linear relationship to the height or depth of the bump or pit or over- or underetch, respectively. It can therefore be used to calculate how far from the nominal quartz height the site is without requiring the use of an atomic force microscope. Additionally, the correct depth value can be extrapolated and correlated back in order to correct a processing step, in particular within a repair process.

Thus, it was found, that from an aerial image stack acquired with the help of a metrology system a Bossung plot 5 can be determined for given regions of the photomask 1. From that Bossung plot 5 at least one parameter can be derived to characterise the respective region of the photomask. Preferably, the Bossung plot 5 is determined with a predetermined two-dimensional spatial resolution of the entire photomask to be analysed. With help of the Bossung plot 5 it is possible to analyse the photomask 1, in particular to determine, whether there are defects 4 in the photomask 1. Moreover, it is possible to derive more detailed information about the defects 4, in particular regarding their nature, in particular whether they are bump defects or pit defects, and their size and/or depth.

Figure 5:
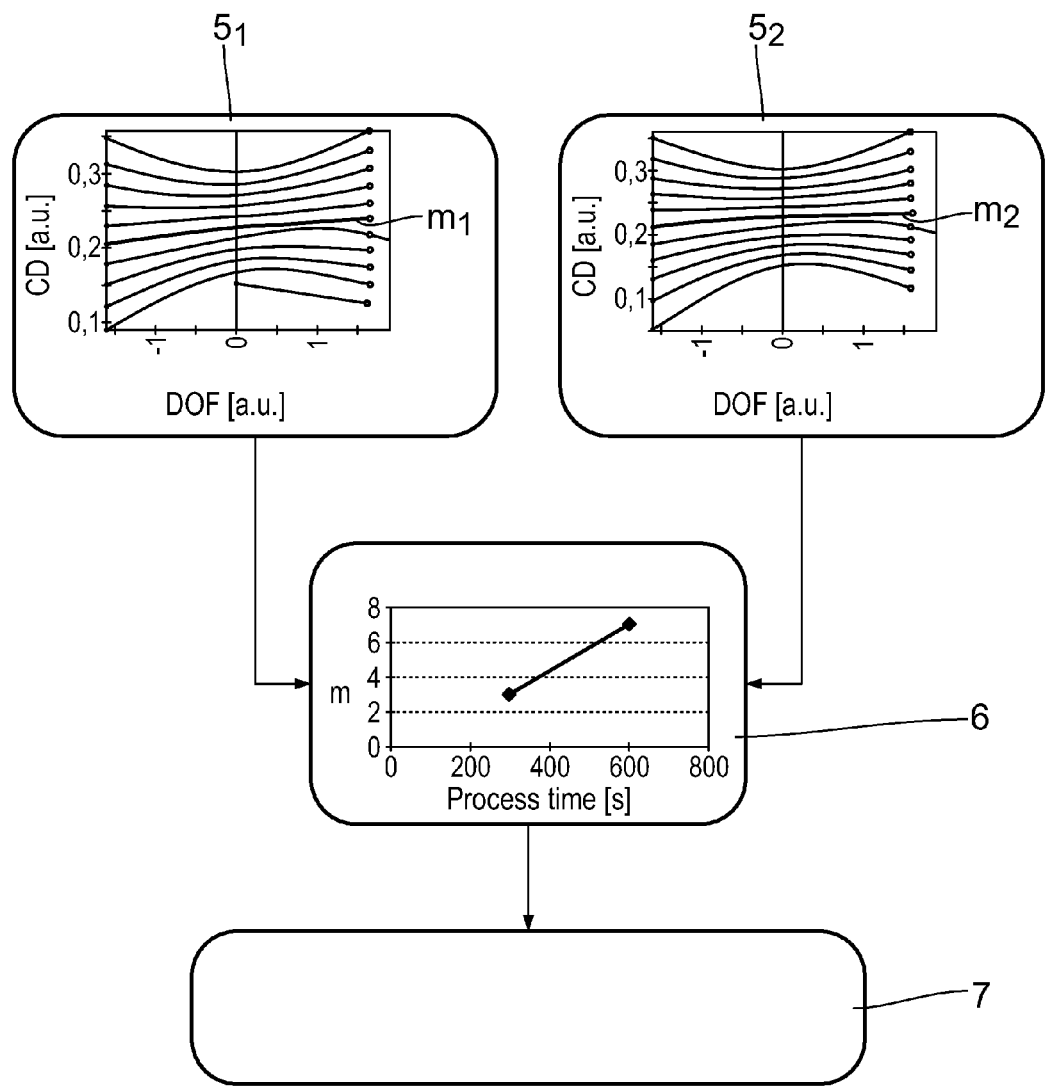
FIG. 5 shows a schematic view of an analysis process used for the repair method.
Figure 6:
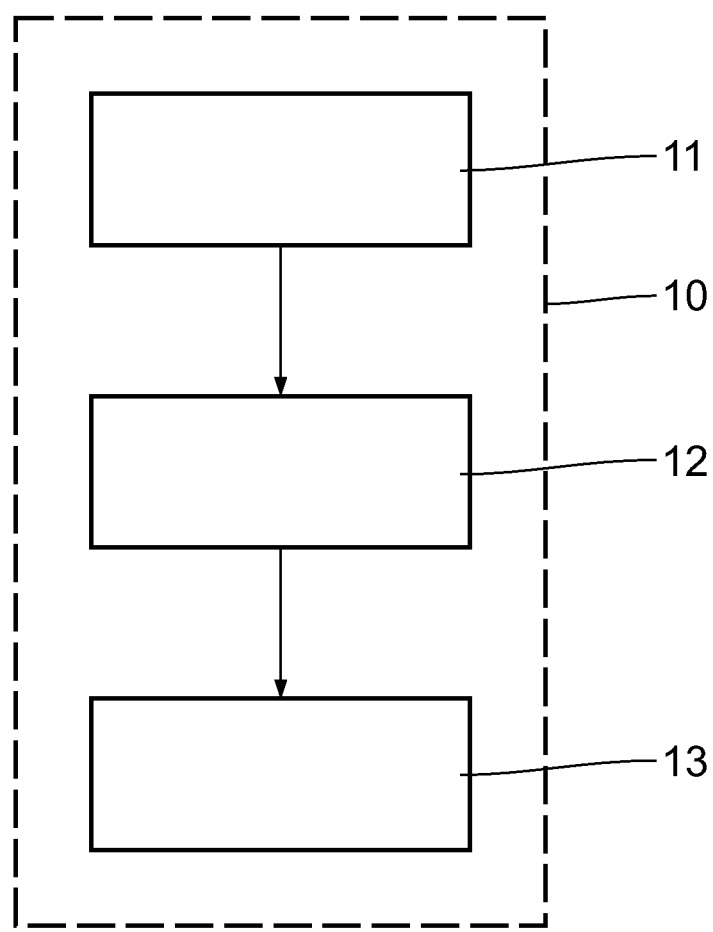
FIG. 6 shows a schematic drawing of a repair system.

This information can be advantageously used within a method for repairing the photomask 1. In particular, from the Bossung plot 5 at least one repair parameter can be determined. This repair parameter can be forwarded to a repair system. In particular, the process required for a repair of the photomask can be determined in dependence of such a repair parameter. This is shown in FIG. 5 in an exemplary way. Herein, a first process is performed for a certain duration. The first process can be a deposition or a removal of material from the photomask 1. The removal can in particular be an etch process. The duration of the process determines the amount of material deposited on or removed from the photomask 1 in this process. After the deposition or removal step a first Bossung plot $5_1$ is determined.

Than, a second process is performed in the same area as the first process. Subsequently, a second Bossung plot $5_2$ is determined.

After that, a first slope $m_1$ is extracted from the first Bossung plot $5_1$. Similarly, a second slope $m_2$ is extracted from the second Bossung plot $5_2$.

Both slopes, $m_1$ and $m_2$, are plotted with their respective overall processing times in a slope of Bossung plot versus process time plot 6. The two data points are fit with a linear regression line. Solving the linear equation for y=0 provides the processing time required to obtain the ideal process height or depth. This is schematically depicted in FIG. 5 as further analysis 7.

From the plot 6 the relationship between the slope m of the Bossung plot 5 and the material height or depth can be determined. Similarly, from the parameters characterizing the Bossung plot 5, information as to the size and/or depth or height, respectively of the defect 4 can be derived.

Such information can be brought into a suitable format and fed forward to a repair tool. The repair tool preferably comprises a processing unit to calculate the optimal parameters of the repair process from such input data. In particular, the data gathered by the metrology system can be forwarded to or accessed by the repair tool. This data can then be used by the software of the repair tool to calculate the parameters, in particular the shape and recipe for a repair process. The repair process can then be performed based on this calculation.

Once the dependence between the slope m of the Bossung plot 5 and process time, in particular the material depth associated therewith, is determined, the ideal process can be chosen for future defects 4 with the same feature and material based on a single Bossung plot 5 of this defect 4. In other words, the first two deposition-analysis- or removal-analysis-cycles can be used to calibrate the repair method. In particular, from this information the amount of material to be deposited on or removed from the photomask 1 can be determined with help of an extrapolation step. Thus, from a Bossung plot 5 a repair parameter comprising a measure for the amount of material to be deposited on or removed from the photomask 1 can be derived.

Advantageously, the entire analysis, in particular the entire repair method can be performed in a fully automated way. Furthermore, the entire repair process can be performed in a single repair system 10.

The repair system 10 comprises a metrology module 11 for acquiring an aerial image stack of the photomask 1, an analysis module 12 for analyzing the aerial image stack of the photomask 1 and for determining at least one repair parameter and a repair module 13. Furthermore, the repair parameter determined by the analysis module 12 is fed forward to the repair module 13. For further aspects of the repair system 10 and/or the repair process reference is made to DE 10 2006 043 874 A1, DE 10 2008 062 928 A1 and DE 10 2011 079 382 A1.

The invention claimed is:

1. A method, comprising:
   using a metrology system to acquire an aerial image stack of a feature of a photomask as a function of a depth of focus;
   determining a Bossung plot for the aerial image; and
   determining a parameter from the Bossung plot to characterize the photomask, and determining based on a slope of the Bossung plot, whether a defect of the photomask is a bump or a pit.

2. The method of claim 1, comprising using a two-dimensional resolution of the entire photomask to determine the Bossung plot.

3. The method of claim 1, comprising using a two-dimensional resolution of the entire feature of the photomask to determine the Bossung plot.

4. The method of claim 1, wherein the parameter provides a measure of a size of the defect of the photomask, and/or the parameter provides a depth of the defect of the photomask.

5. The method of claim 4, wherein the photomask is a reflective photomask.

6. The method of claim 1, wherein the method is fully automated.

7. The method of claim 1, wherein the method is performed in a standalone metrology system.

8. The method of claim 1, further comprising:
   determining a repair parameter from the Bossung plot; and
   repairing the photomask based on the repair parameter.

9. The method of claim 8, wherein repairing the photomask comprises at least one process selected from the group consisting of depositing material on the photomask and removing material from the photomask.

10. The method of claim 9, further comprising, after performing the at least one process, analyzing the repaired photomask.

11. The method of claim 8, wherein repairing the mask comprises at least one process selected from the group consisting of depositing material on the feature of the photomask and removing material from the feature of the photomask.

12. The method of claim 11, further comprising, after performing the at least one process, analyzing the repaired photomask.

13. The method of claim 8, comprising analyzing the photomask more than once.

14. The method of claim 8, further comprising using extrapolation to determine an amount of material to be deposited on the photomask or an amount of material to be removed from the photomask.

15. The method of claim 8, wherein the repair parameter comprises a measure for the amount of material to be deposited on the photomask or an amount of material to be removed from the photomask.

16. The method of claim 8, wherein the method is fully automated.

17. The method of claim 8, wherein the method is performed in a single system.

18. A method, comprising:
   using a metrology system to acquire an aerial image stack of a feature of a photomask as a function of a depth of focus;
   determining a Bossung plot for the aerial image;
   determining a repair parameter from the Bossung plot; and
   repairing the photomask based on the repair parameter, wherein repairing the mask based on the repair parameter comprises at least one process selected from the group consisting of depositing material on the feature of the photomask and removing material from the feature of the photomask.

19. The method of claim 18, wherein the method is performed in a single system.

20. A system, comprising:
a metrology module configured to acquire an aerial image stack of a photomask as a function of a depth of focus;
a module configured to: a) analyze the aerial image stack of the photomask; and b) determine a repair parameter based on a Bossung plot determined from the aerial image stack; and
a repair module configured to receive the repair parameter, and deposit material on or remove material from a feature of the photomask based on the repair parameter.

21. A method, comprising:
using a metrology system to acquire an aerial image stack of a feature of a photomask as a function of a depth of focus;
determining a Bossung plot for the aerial image; and
determining a parameter from the Bossung plot to characterize the photomask, wherein the parameter provides a measure of a size of a defect of the photomask, and/or the parameter provides a depth of a defect of the photomask.

* * * * *

UNITED STATES PATENT AND TRADEMARK OFFICE
CERTIFICATE OF CORRECTION

PATENT NO. : 9,261,775 B2
APPLICATION NO. : 14/192362
DATED : February 16, 2016
INVENTOR(S) : Anthony Garetto et al.

Page 1 of 1

It is certified that error appears in the above-identified patent and that said Letters Patent is hereby corrected as shown below:

In the specification,

Col. 1, line 64, after "parameters", insert -- . --.

Col. 2, line 23, delete "photomask" and insert -- photomasks --.

Col. 2, line 27, delete "photo-mask" and insert -- photomask --.

Col. 4, line 32, after "slope", insert -- m‾, --.

Col. 4, line 38, after "5", insert -- . --.

Col. 5, line 17, delete "Than," and insert -- Then, --.

Signed and Sealed this
Sixteenth Day of August, 2016

Michelle K. Lee
*Director of the United States Patent and Trademark Office*